United States Patent [19]

Fekete et al.

[11] 4,347,612

[45] Aug. 31, 1982

[54] SEMICONDUCTOR INJECTION LASER FOR HIGH SPEED MODULATION

[75] Inventors: Dan H. Fekete, Palo Alto; Donald R. Scifres, Los Altos; William Streifer, Palo Alto, all of Calif.

[73] Assignee: Xerox Corporation, Stamford, Conn.

[21] Appl. No.: 181,263

[22] Filed: Aug. 25, 1980

[51] Int. Cl.$^3$ ............................................. H01S 3/19
[52] U.S. Cl. ...................................... 372/50; 372/46; 372/26
[58] Field of Search .................... 331/94.5 H, 94.5 M; 332/7.51; 372/26, 46, 50

[56] References Cited

U.S. PATENT DOCUMENTS

| | | | |
|---|---|---|---|
| 4,185,256 | 1/1980 | Scifres et al. | 331/94.5 H |
| 4,219,785 | 8/1980 | Scifres et al. | 331/94.5 H |
| 4,255,717 | 3/1981 | Scifres et al. | 331/94.5 H |

*Primary Examiner*—James W. Davie
*Attorney, Agent, or Firm*—W. Douglas Carothers, Jr.

[57] ABSTRACT

A semiconductor injection laser is provided with an integrated optical injector means on same substrate as the laser which has an optical emitter region noncolinear with the axis of optical emission from the laser but optically coupled to the laser at one or more points along its length. The optical injector means is independently operative prior to or simultaneously with the independently operated laser to inject radiation into the laser optical emitter region to decrease the response time of the laser to pulsed current modulation.

6 Claims, 10 Drawing Figures

SEMICONDUCTOR INJECTION LASER FOR HIGH SPEED MODULATION

BACKGROUND OF THE INVENTION

This invention relates to semiconductor injection lasers having integrated optical injection means to enhance their response time to pulsed current modulation.

Because of their small size, high efficiency, large scale integration capability and direct modulation capability, semiconductor lasers are highly desirable as transmitters for integrated high speed optical communication systems.

Unfortunately, the rate of direct modulation is limited by serious distortion of the radiation output waveform caused by relaxation oscillations of the radiation intensity output upon modulation of the laser. Thus, for practical applications of modulation, the modulation rate is bounded by the relaxation oscillation frequency.

Several solutions have been proposed to overcome or suppress the relaxation oscillations in semiconductor lasers. These solutions have all required auxiliary optical components which are used to inject external light into the modulated laser. The injected light (1) lowers the intensity pulse amplitude at the onset of lasing, (2) increases the damping of the residual relaxation oscillations and (3) eliminates the peak in the laser frequency response characteristic. As an alternative, a bias current can also be used to improve the modulation characteristics. However, the last two mentioned changes (2) and (3) do not take place if a bias current, rather than optical radiation injection, is employed to reduce relaxation oscillation.

Illustrations are found in U.S. Pat. Nos. 4,038,610, 4,101,845 and 3,295,911, and in published articles of P. T. Ho, L. A. Glassen, E. P. Ippen and H. P. Hans in *Applied Physics Letters*, Volume, 33, page 241 (1978); of P. T. Ho in *Electronics Letters*, Volume 15, page 526 (1979); and of L. Figueroa, K. Y. Lau and A. Yarin in *Applied Physics Letters*, Volume 36, page 248 (1980); R. Lang and K. Kobayashi in the *IEEE Journal of Quantum Electronics* in Volume QE-12, page 194 (1976) and in Volume QE-11, page 600 (1975); P. Russer, Laser 1975 Optoelectronics Conference Proceedings (Munchen, Germany, 1975), page 161 and H. Hillbrand and P. Russer, *Electronics Letter*, Volume 11, page 372 (1975).

SUMMARY OF THE INVENTION

According to this invention, an integral non-colinear light injector means is employed in conjunction with a semiconductor injection laser to suppress relaxation oscillations which was not possible with any of the previously mentioned proposed solutions. The optical injector means is not co-linear with the straight semiconductor laser but is optically coupled to the laser. The optical injector means is independently operated from the laser and is typically operative prior to or simultaneously with the operation of the laser to inject photons or radiation produced in its own light emitting region into the laser thereby eliminating undesirable relaxation oscillations while simultaneously decreasing the response time of the laser to pulsed current modulation. Laser radiation pulses as short as 200 psec. duration have been observed. Shorter pulses are possible with electronic addressing capable of providing shorter current modulation pulses.

Optical coupling of the laser and injector means may be by a common connection or by disposing the light emitting regions or optical cavities in proximity to each other so that there is radiation overlap from one region into the other. The injected photons may be in the form of feedback laser radiation created above lasing threshold and/or radiation by spontaneous emission wherein injection current is below lasing threshold, e.g., an LED.

More than one laser may be provided on the same semiconductor chip with a single or multiple injector means optically coupled two or more adjacent pairs of lasers.

Other objects and attainments together with a fully understanding of the invention will become apparent and appreciated by referring to the following description and claims taken in conjunction with the accompanying drawings.

BRIEF DESCRIPTION OF THE DRAWINGS

In FIG. 4 proximity coupling is illustrated. In FIG. 5 direct coupling is illustrated with a DFB injector means providing the injected radiation. In FIG. 6, direct coupling is illustrated with a ring LED comprising the injector means. In FIG. 7, proximity coupling illustrated between a pair of lasers and one injector means.

DETAILED DESCRIPTION OF PREFERRED EMBODIMENTS

Figure 1:
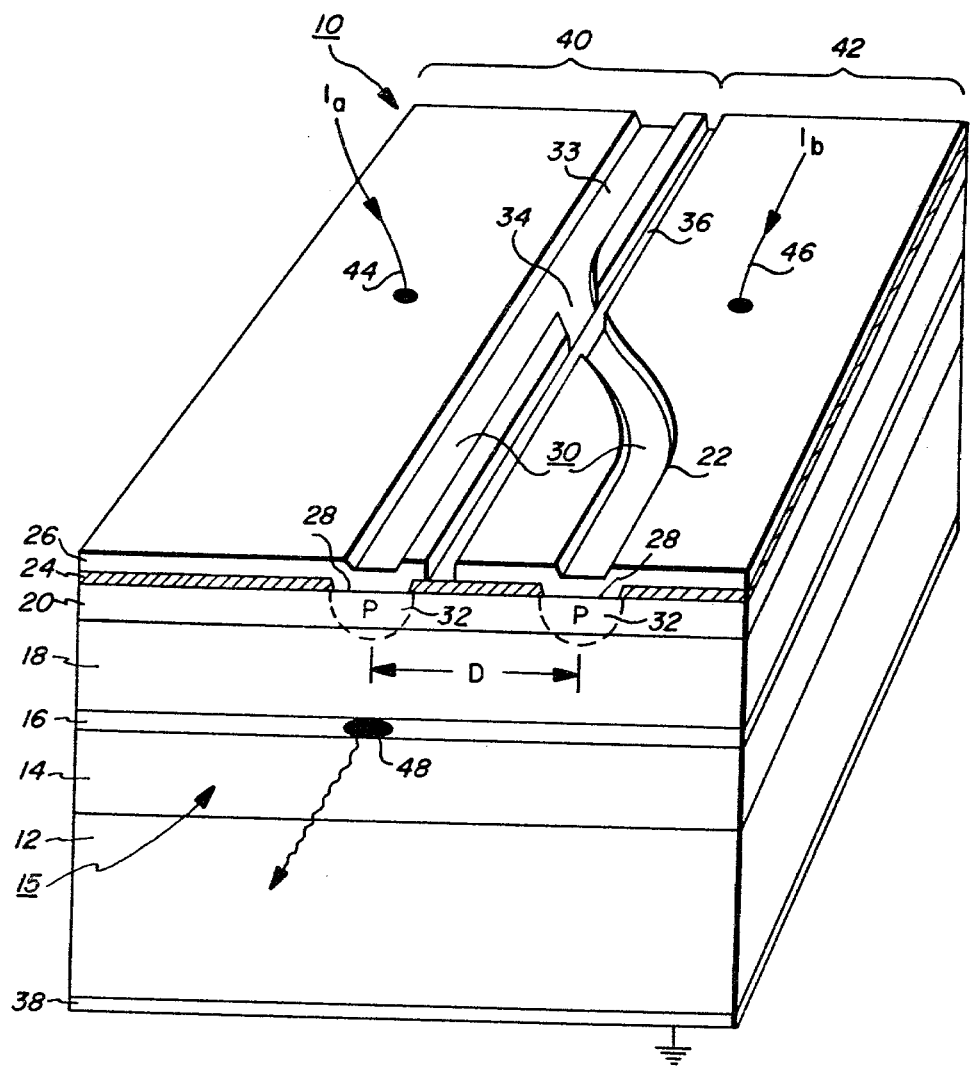
FIG. 1 is a schematic illustration of a semiconductor laser for high speed modulation according to this invention.

In FIG. 1, the semiconductor injection laser 10 for high speed modulation comprises a substrate 12 upon which are successive epitaxially deposited cladding layer 14, active layer 16, cladding layer 18, contact facilitating layer 20. Laser 10 may be a conventional heterostructure laser. For example, laser 10 may comprise substrate 12 of n-GaAs, layer 14 of $Ga_{0.6}Al_{0.4}As$, active layer 16 of $p-Ga_{0.95}Al_{0.05}As$, layer 18 of is $p-Ga_{0.6}Al_{0.4}As$ and layer 20 of n-GaAs.

Laser 10 also includes an integrated optical injector means 22 in the form of a branching radiation waveguide for providing an external source of radiation into the optical cavity of the laser.

The laser and branching waveguide geometry are formed as follows. An insulating layer 24, such as, $Si_3N_4$ is deposited on the contact layer 20. Using conventional photolithography and plasma etching techniques, the aperture geometry 28 is formed in layer 24 forming the branching stripe pattern 30 as shown. Next, a zinc diffusion performed through the aperture geometry 28 of layer 24 to the depth of cladding layer 18, which converts the contact layer 20 in regions 32 to the opposite conductivity type, which, in this illustration, are p type regions, beneath the stripe pattern 30. Contact 26 is provided by an evaporated metallization, such as a Cr/Au metalization. Also, a metallized contact 38 is provided on the bottom surface of substrate 12.

A strip of the metalization in contact 26 is chemically removed to layer 24 with an etchant acting on gold forming a photolithographically delineated stripe 36 along the entire length of the laser 10. Strip 36 electrically isolates the laser section 40 from the injector means section 42. An electrical contact 44 is provided for the laser section 40 and an electrical contact 46 is provided for the injector section 42. Driving current $I_a$ is supplied to the laser section 40 via contact 44. Driving current $I_b$ is supplied to the injector section 42 via contact 46. A common electrical return is via contact 38.

Laser section 40 is independently pumped via contact 44 producing stimulated radiation under lasing conditions in an optical cavity established in active layer 16 beneath current confinement means in the form of linear stripe portion 33, and became a radiation emitter region represented by the radiation emission 48 from mirror facet 15. Feedback necessary for lasing conditions is provided by mirror facets 15 and 17. Mirror facet 15 also provides radiation feedback at injector means 22 to enhance radiation injection into the laser optical cavity.

Although radiation feedback in injection means 22 is provided by mirror facet 15 or, for that matter, by any other conventionally employed feedback means, such feedback is not necessary to achieve the attributes of the present invention. For example, injection means 22 need only be an injector of spontaneous radiation emission, such as an LED. The mirror facet at the point of feedback could be scratched or otherwise treated so as not to function as a feedback amplifier for radiation. The important attribute is that the radiation injector means must be independently pumped and non colinear with the laser optical cavity.

The branching waveguide pattern 30 may be characterized as overlapping stripe geometry for length $l_1$, to the point of bifurcation 34, from which point the branch representing injector means 22 gradually curves and separates from the linear stripe portion 33.

Figure 2:
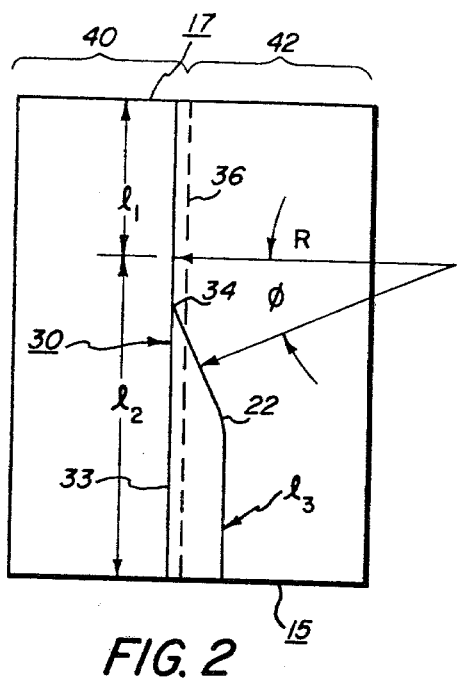
FIG. 2 is a schematic plan view of the light emitting regions of the laser of FIG. 1.

As shown in FIG. 2, its radius, R, is 1 mm and the angle $\Phi$ is 9.37°. In this bifurcated portion of the structure, from the bifurcation point 34, the straight guide length to facet 15 is designated $l_2$ and the straight branch guide length to facet 15 is $l_3$. The current $I_a$ pumps both $l_1$ and $l_2$, whereas $I_b$ pumps only $l_3$. For the embodiment shown, the length, $l_1$, is 70 μm, $l_2$ is 240 μm and $l_3$ is 241 μm and the separation D, is 25 μm. The total length of the laser 10 is, therefore, about 210 μm. The threshold for lasing conditions is about $I_a$ ($I_b=0$) equal 128 mA in pulsed operation.

During high speed modulation, the injector section 42 is continuously pumped in order to inject radiation into the laser optical cavity via optical coupling at point 34 while section 40 is pulsed or modulated at a desired frequency. Under this condition a small cross current may flow from section 42 to section 40. In the embodiment shown, for $I_b=300$ mA and $I_a$ equal zero, the cross current was 20 mA. The measured electrical resistance between sections 40 and 42 is about 90 ohms. This cross current acts as a biasing current and is relatively low when compared to the threshold current of the laser. The cross current is effective to reduce the time required to obtain pulsed radiation output upon current pulse application by about 23% as well as induce some guidance of the radiation or photons injected into the laser. However, the cross-current is not necessary for the implementation of this invention.

The injected radiation from the injector means 22 need not be coherent radiation. Means 22 need only be operated below lasing threshold to provide incoherent radiation or operate as a spontaneous emission device, such as, an LED or as a device with gain to inject amplified spontaneous emission which is partially coherent. External photon or radiation injection into the laser from an integrated source is what is desired.

Figure 3:
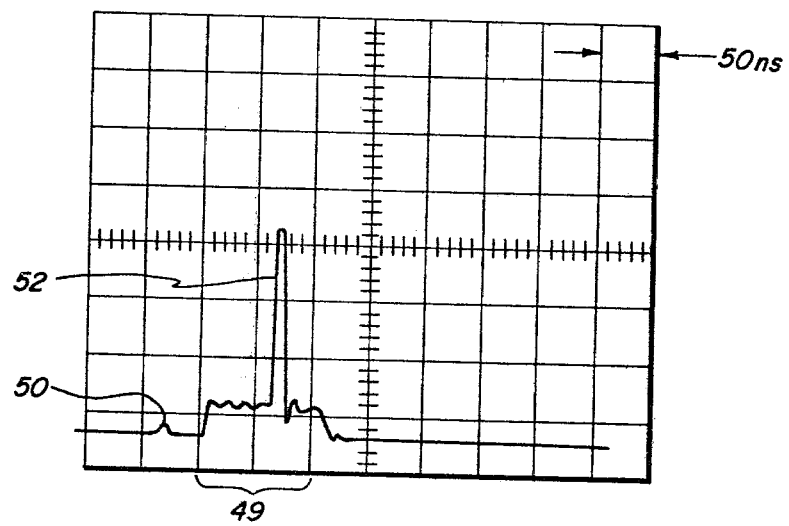
FIG. 3 shows observed output response of the laser of FIG. 1 with and without operation of the radiation injector means.

To illustrate the enhancement of response time in modulation of the laser section 40, FIG. 3 graphically illustrates optical output verses current. In this illustration, the pulsed current for injector section 42 was $I_b$ equal 300 mA and the pulses current for laser section 40 was $I_a$ equal to 170 mA. The period of the single pulse for current $I_b$ is represented by bracket 49 in FIG. 3, the period being 100 nsec. The laser section 40 was modulated with shorter pulses, the second of which coincides with the injected radiation pulse 49. The small peak 50 is the laser output during the first current pulse whereas the pulse 52 is the laser output during the application of the 100 nsec. pulse 49. The output of pulse 50 is estimated to be about 1 mW whereas the output of pulse 52 is estimated to be in excess of 20 mW. The output power of the laser is in excess of twenty times when radiation is fed back into the laser optical cavity 48 from the injector means 22 and the response in output is substantially immediate.

Experimental results show by independent operation of the injector means 22 with the modulation of the laser section 40, the radiation output response of the modulated laser with photon injection are substantially identical to the imposed current pulses via contact 44 without any delay and without relaxation oscillations. In contrast with no injected photon, i.e., $I_b$ equal zero, the comparative on/off switching states are gradual due to relaxation oscillations. In the absence of injected photons, the laser will not respond to short psec. pulse modulation independent of pulse current level because of the long delay times encountered between pulse addressing and optical output emission. 200 psec. substantially square optical pulse outputs from cavity 48 have been obtained with square current pulse modulation having a 200 psec. pulse width. Evidence supports that laser 10 is capable of being modulated with current pulses substantially less than 100 psec. duration via suitable addressing electronics, producing radiation output pulses of equal pulse width.

In order to support the transient response of the photon injected laser 10, the following mathematical analysis is made. One begins with the usual formulation relating to cavity photon number, N, and total inverted population, n (for $l_1$ plus $l_2$), but with the addition of two terms. One term represents external injected incoherent radiation from injector means 22 into the lasing mode (strength S) and the second term, $G_2N$, represents the feedback and incorporates the net roundtrip gain $G_2$ of section 42. Thus:

$$dN/dt = K(N+1)n - \Gamma N + S + G_2N + K(N+1)n - \Gamma_1 N + S \tag{1a}$$

where $$\Gamma_1 = \Gamma - G_2$$

$$dn/dt = -KnN - (n/\tau_{sp}) + P \quad (1b)$$

where K is the optical transition probability constant, $\Gamma$ is the loss of the straight cavity, and $\tau_{sp}$ is the spontaneous emission lifetime. $P = j/ed$ is the injection rate per unit volume which is related to the excitation current density j, the electronic charge e, and the laser active region thickness, d.

In the steady state, the derivatives in (1a), (1b) are set equal zero and $$N = \{S + \Delta P + [(S + \Delta P)^2 + 4(P\Gamma_1 + SP_{th})]^{\frac{1}{2}}\}/2\Gamma_1 \quad (2)$$

where $$\Delta P = P - P_{th} = P - \Gamma_1/K\tau_{sp}.$$

If a perturbation is performed about the steady state values of N and n, with small changes $\delta N$ and $\delta n$, the following equations can be derived.

$$\delta N/dt = KN\,\delta n - (S/N)\delta N$$

$$\delta n/dt = -(KN + 1/\tau_{sp})\delta n - (S/n - \Gamma_1)\delta N \quad (3)$$

These linear perturbation equations have solutions exp(st), and the exponent s is given by:

$$s = -1/\tau_d \pm i\,\omega_{RO} \quad (4)$$

Where the decay constant $1/\tau_d$ and the RO frequency $\omega_{RO}$ are:

$$2/\tau_d = 1/\tau_{sp} + KN + S/N \quad (5)$$

$$\omega_{RO}^2 = KN\Gamma_1 + (S/N)/\tau_{sp} - 1/\tau_d^2 \quad (6)$$

Clearly $\omega_{RO}$ may be set equal to zero by adjusting either the incoherent external radiation strength or the external gain $G_2$. However, only S acts to shorten $1/\tau_d$ in equation (5) whereas $G_2$ has no effect on this quantity. In addition, excessive increases in S will convert $\omega_{RO}$ to an imaginary quantity thereby modifying equation (4) and adversely affecting the rise time, i.e., although the rise will be no relaxation oscillation, the rise time will be increased. For typical values of $\Gamma_1$ equal to $10^{12}$ sec$^{-1}$ and $1/\tau_{sp}$ equal to $10^9$ sec$^{-1}$, completesuppression of relaxation oscillation is achieved for a value of $S/N \geq 0.03\,\Gamma_1$. We have from experimentation observed that much less injected radiation is needed to completely suppress relaxation oscillation than would be required without feedback. To determine the relative magnitudes of $\Gamma_1$ and $\Gamma$, the differential quantum efficiency of the laser is compared with and without pumping of the injection means 22, and find $\Gamma_1$ equal approximately to $0.45\Gamma$. Thus, the effect of the injector means round trip gain $G_2$ is to reduce the injected light intensity required to suppress relaxation oscillation to $S/N \approx 0.0135\Gamma$.

Alternative integrated injector means for utilization with laser 10 are illustrated in FIGS. 4–10.

Figure 4:
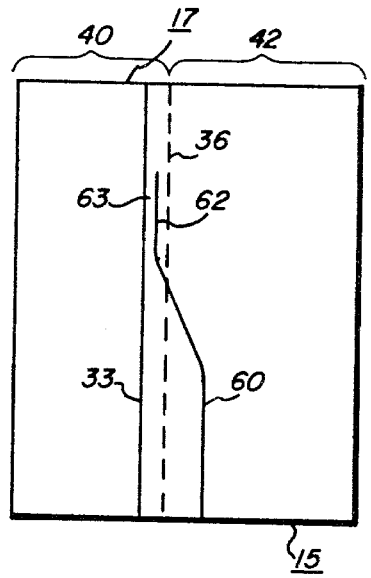
FIGS. 4 through 7 are schematic plan views of the laser and different optical injector means illustrating various ways in which optical coupling is achieved.

In FIG. 4, the injector means 60 is similar in stripe geometry to injector means 22 in FIG. 1 except the stripe end portion 62 does not directly connect to laser stripe 33. Instead, portion 62 is separated so that photon or radiation injection is accomplished by proximity optical coupling with the overlapping radiation field intensity from the optical cavity of injector means 60 into radiation field intensity of the laser section 40 as represented by linear stripe portion or emitter 33. Proximity spacing 63 may typically be around 10 μm.

Figure 5:
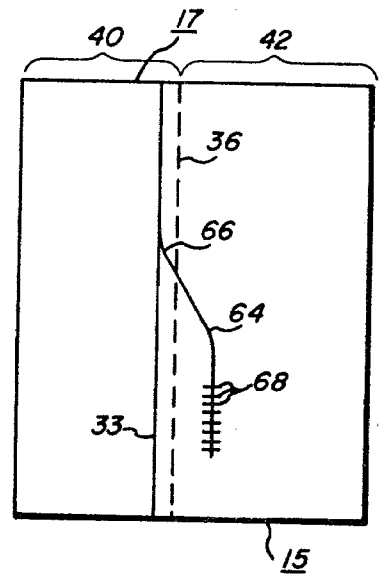

In FIG. 5, the injector means 64 has optical coupling via direct waveguide connection at 66, as in the case of FIG. 1. Injector means 64 provides radiation feedback with distributed feedback grating 68, conventionally known in the art. Alternatively, no feedback need be provided with injector means 64 functioning as an LED.

Figure 6:
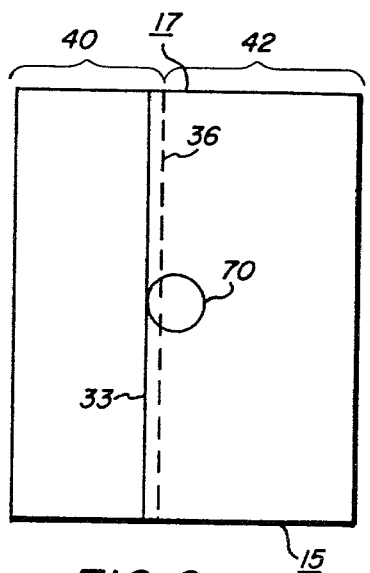

In FIG. 6, the LED ring resonator 70 is directly coupled to the laser optical cavity for injection of photons or radiation into the laser optical cavity.

Figure 7:
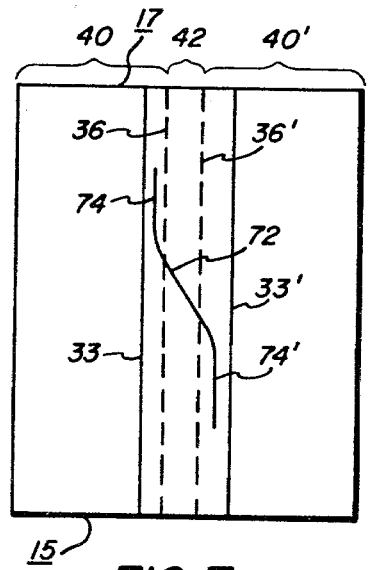

In FIG. 7, a pair of laser cavities represented by emitters 33 and 33' are pumped by a single injector means 72 in section 42, which is isolated from lasing sections 40 and 41' by isolation stripes 36 and 36'. Proximity optical coupling is provided at 74 and 74', in the manner previously described relative to FIG. 4, for injection of radiation into the laser optical cavities represented by emitters 33 and 33'.

Figure 8:
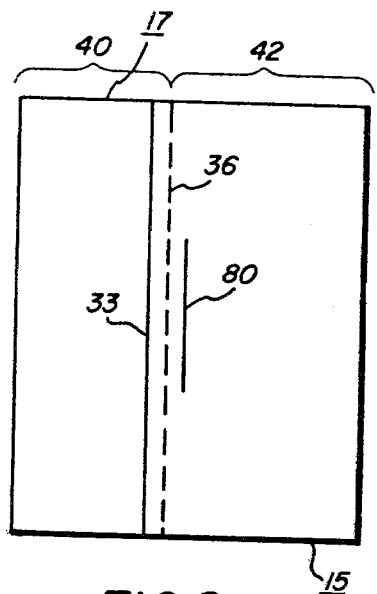
In FIG. 8, proximity coupling is illustrated between a laser cavity and a short optical emitter.

In FIG. 8, the laser emitter region 33 is coupled to a short optical emitter or injector means 80 which functions as an LED. Coupling is accomplished via the close proximity of the two emitters 33 and 80. Typical spacing between the emitters might be about 10 μm.

Figure 9:
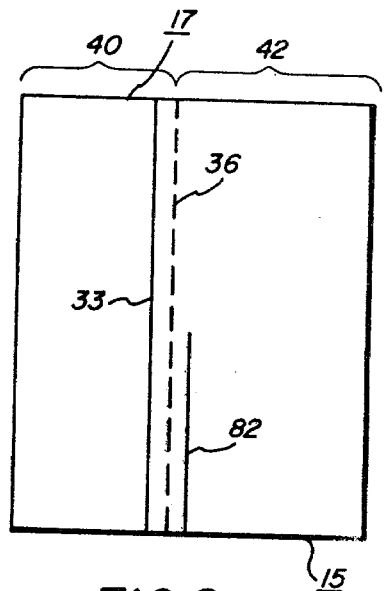
In FIG. 9, proximity coupling is illustrated by a combined LED as an optical injector, having radiation feedback and a laser cavity.

In FIG. 9, proximity coupling is provided by optical injector means 82 which functions as an LED with feedback in this injector branch provided by facet 15.

Figure 10:
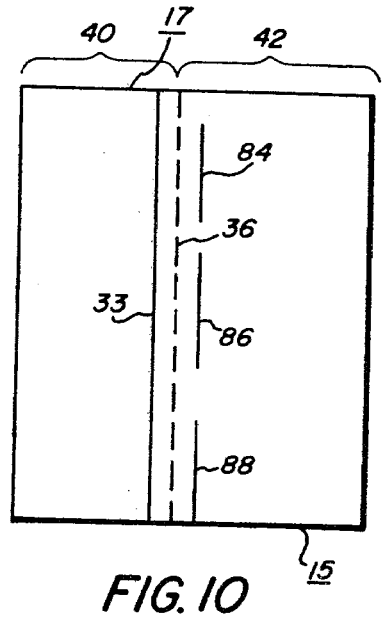
In FIG. 10, represents a combined illustration of FIGS. 8 and 9 wherein multiple optical injectors are employed.

In FIG. 10, multiple optical injector means 84, 86 and 88 are illustrated. Injector means 84, 86 and 88 are proximity coupled to emitter 33. Each injector provides some radiation into the cavity of emitter 33. Injectors 84 and 86 are similar to injector 80 while injector 88 functions with feedback like injector 82. The concept of multiple injectors disclosed in FIG. 10 may also be employed in the configurations shown in FIGS. 4–7.

In conclusion, the laser 10 with associated injector means may be modulated at very high modulation rates without severe limitations imposed by relaxation oscillations to produce pulse widths of radiation output substantially under 100 psec. duration in an above 10 G bit/sec optical transceiver. Such a device is suitable for many large scale integration applications for optical communication systems and is especially suited for electrooptic integration with field effect transistors.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims. For example, the laser disclosed is equally applicable to other types of semiconductor materials having different bandgaps. Also, equally applicable are reversed conductivity types and other conventional types of current confinement fabricated into the laser device.

What is claimed is:

1. In a semiconductor injection laser for high speed modulation wherein several layers of semiconductor material are fabricated on a semiconductor substrate, one of said layers forming an active layer wherein radiation is generated upon forward biasing of said laser and upon applying pumping current to said active layer in excess of its lasing threshold whereby an optical emitter region is created having an axis along which the generated radiation propagates characterized by optical injector means on the same substrate as said laser and having its own optical emitting region non-colinear with the axis of optical emission of said laser but optically coupled thereto at at least one point therealong and, means operatively associated with said optical injector means to cause said injector means to inject radiation into said laser optical emitter region just prior to or concurrently with the pulsing of said laser to decrease the response time of said laser to pulsed current modulation.

2. In the semiconductor injection laser of claim 1 wherein the optical emitter regions of said laser and injector means are optically coupled via a common connected portion.

3. In the semiconductor injection laser of claim 1 wherein the optical emitter regions of said laser and injector means are optically coupled by disposing them in proximity to each other such that there is overlapping radiation from said injector means into the emitter region of said laser.

4. In the semiconductor injection laser of claim 1 wherein there is more than one laser on said substrate with any pair of said lasers being optically coupled at one point along their axis of radiation propagation by single optical injector means.

5. In the semiconductor laser of claim 1 wherein there is more than one optical injector means on said substrate to inject radiation into said laser emitter region.

6. In the semiconductor laser of claim 5 wherein there is more than one laser on said substrate with any pair of said lasers being optically coupled at one point along their axis of radiation propagation by one or more optical injector means.

* * * * *